United States Patent [19]
Zilliox

[11] Patent Number: 5,032,843
[45] Date of Patent: Jul. 16, 1991

[54] PULSE COMPRESSION RADAR AND APPLICATION FOR MAPPING OR METEOROLOGY

[75] Inventor: Jean-Marie Zilliox, Paris, France

[73] Assignee: U.S. Philips Corporation, New York, N.Y.

[21] Appl. No.: 283,652

[22] Filed: Dec. 13, 1988

[30] Foreign Application Priority Data

Dec. 23, 1987 [FR] France ............................ 87 18047

[51] Int. Cl.⁵ .................... G01S 13/522; G01S 13/89
[52] U.S. Cl. .................................... 342/202; 342/204
[58] Field of Search ................. 342/83, 88, 130, 131, 342/132, 200, 201, 202, 203, 204

[56] References Cited

U.S. PATENT DOCUMENTS

| | | | |
|---|---|---|---|
| H205 | 2/1987 | Green et al. | 342/134 |
| 3,940,696 | 2/1976 | Nagy | 342/202 |
| 4,063,182 | 12/1977 | Besson | 342/202 X |
| 4,107,630 | 8/1978 | Schucht | 342/202 |
| 4,201,986 | 5/1980 | Ducrocq | 342/100 |
| 4,268,828 | 5/1981 | Gibbs et al. | 342/26 |
| 4,306,237 | 12/1981 | Tresselt | 342/202 |
| 4,319,246 | 3/1982 | Fitz | 342/175 |
| 4,427,982 | 1/1984 | Caprio | 342/159 |
| 4,665,401 | 5/1987 | Garrard et al. | 342/75 |
| 4,682,175 | 7/1987 | Lazarus | 342/165 |
| 4,682,178 | 7/1987 | Anflo et al. | 342/202 |

Primary Examiner—John B. Sotomayor
Attorney, Agent, or Firm—Robert J. Kraus

[57] ABSTRACT

A radar device, of the almost linearly frequency-modulated type of the transmission signal during the pulse, comprises a transmit circuit including a high-frequency oscillator (29), a transmit-receive aerial (7) and a receive circuit including a pulse compression element (33). According to the invention, inside the transmit circuit, an Impatt diode (17) of a diode switch (16) produces directly at microwave frequency a synchronizing signal of the oscillator (pulses modulated in accordance with negative frequency slopes). For this purpose, a clock pulse generator (26) commands a switch (25) arranged in series on the conductor (19) of the supply current of the Impatt diode (17) which current is substantially continuous, to conduct for the duration of each pulse to be transmitted.

10 Claims, 6 Drawing Sheets

PULSE COMPRESSION RADAR AND APPLICATION FOR MAPPING OR METEOROLOGY

BACKGROUND OF THE INVENTION

The invention relates to a pulse compression radar of the almost linearly frequency-modulated type of the transmitted signal during the pulse, comprising a transmit circuit including a high-frequency oscillator/amplifier, a transmit-receive aerial and a receive circuit having a pulse compression element.

The pulse compression radars have a multitude of applications. They operate for the greater part in the X-band and can be arranged on the ground or be airborne. In the latter case, they are specifically used for maritime surveillance, mapping and meteorology.

In these radars, travelling-wave tubes are currently used as high-frequency oscillator-amplifiers in the transmit circuits, that is to say as power sources. It is likewise possible to use solid state Impatt diode power sources.

The principle of the pulse compression radars is widely known and described, for example, in "Technique de l'ing énieur, Electronique", Vol. 5, E 6660-1, 24. Compared to the conventional pulse radar, the pulse compression radar allows to maintain the independence between the duration T and the band $\Delta F$ of the signal, which leads to the compression coefficient: $T.\Delta F$. From a practical point of view this means that at an equal power level of the two aforementioned types of radar, the range and definition of the pulse compression radar are better as regards the compression coefficient compared to the pulse radar having the same power level. This fundamental advantage is gained by means of a complication of the radar system. With conventional power amplifying pulse radar, a filter $\gamma(f)$ shifting the phase of the various frequencies of the spectrum of the transmitted signal in different ways, is to be inserted after the slicer of the intermediate-frequency transmission signal, and at the receive end, after the frequency change, a filter $\gamma^*(f)$ which is to compensate for the phase-shifts caused by the filter $\gamma(f)$. All the practical methods narrow down to using, for the pulse expansion a linear or almost linear modulation of the frequency of the transmitted signal, followed by a reversed linear frequency modulation at the receive end. It should be observed that the transmit circuit obtained thus is complex because it comprises, upstream of the microwave-frequency oscillator/amplifier, the following cascaded elements: a first local oscillator OL1 which produces the intermediate frequency, a slicer for shaping the pulses transmitted at intermediate frequency, the filter (f) always operating at intermediate frequency and a mixer which receives at a second input the signal from a second local oscillator OL2. Besides, if one wishes to modify the characteristics of the prior art pulse compression radar, the two filters $\gamma(f)$ and $\gamma^*(f)$ which have to remain adapted to each other are to be changed. Various techniques have in turns been used to manufacture the filters $\gamma(f)$ and $\gamma^*(f)$: distributed filters, acoustic filters, bulk wave quartz lines, more recently ground-wave comb-shaped transducer lines or analog sampled lines. To produce the low-power high-frequency pulse signal, it is not always necessary to use a dispersive line for the filter $\gamma(f)$, because it can also be produced directly, just like an oscillator command. However, even in the latter case, the oscillator operates at intermediate frequency and the obtained system remains complex and thus expensive.

SUMMARY OF THE INVENTION

It is an object of the present invention to utilize the temperature drift of a pulse-operated Impatt diode, which produces a substantially linear decrease of the frequency of the signal transmitted by the diode for the duration of the pulse.

It is a further object of the invention to produce directly a pulse signal that has a high frequency and a mean power level and shows a linear or almost linear frequency variation during the pulse.

It is yet another object of the invention to realise a pulse compression radar of a simple concept, in which the synchronizing signal of the microwave-frequency oscillator/amplifier is directly obtained at microwave frequency.

It is a still further object of the invention to restrict the elements operating at intermediate and microwave frequencies in the transmit circuit of a pulse compression radar to a minimum.

It is yet a further object of the invention to realise a simple and reliable radar for mapping and/or meteorological purposes.

According to the invention these objects are accomplished and the prior art disadvantages diminished due to the fact that the radar defined in the opening paragraph of the description is characterized in that in the transmit circuit an Impatt diode of a diode sequence switch produces directly at microwave frequency a synchronizing signal of the above oscillator/amplifier which consists of pulses modulated in accordance with negative frequency slopes, in that a supply circuit feeds this Impatt diode with a substantially continuous current and, for the generation of each transmission pulse, in that a clock pulse generator sequentially commands the closing and opening of a switch, arranged in series on the supply conductor of this Impatt diode.

When studying the operation of a multiple Impatt diode sequence switch, it will be established that when the switch is not synchronized, because the synchronizing signal is absent in the resonant cavity of the switch, the spectrum is very wide and does not resemble a pulse spectrum T in width having a continuous frequency during the pulse and having a pulse repetition frequency FR. This is due to the fact that during the pulse a frequency variation takes place due to the rising of the junction temperature of the diode. If a multiple Impatt diode switch is used as a power source in a conventional pulse radar, we are facing a fault therein and it is advisable for removing this fault either to synchronize the multiple diode switch with the continuous frequency by means of a microwave-frequency signal, or to modify the form of the modulating current in the Impatt diodes so as to compensate for the parasitic frequency variation. On measuring the frequency variation during the pulse one will find that, when disregarding the first and last microseconds at the beginning and at the end of the pulse, the frequency variation is practically linear for a continuous modulating current during the pulse. The basic idea of the invention is to make use of this particularity in the operation of an Impatt diode in a multiple diode switch by directly utilizing the output signal of an Impatt diode switch as the synchronizing signal of the power source in a pulse compression radar. As already indicated above, the relevant power source can specifically be a progressive wave tube or a multiple Impatt diode switch. The travelling wave tubes (T.W.T.) used especially in airborne radars can provide a power level reaching a maximum of up to 10 kW, for pulse widths comprised between several tenths of a microsecond and several tens of microseconds, with cyclic coefficients of approximately 2%. At these high power levels the T.W.T.s are supplied by voltages and currents of approximately 12500 V and 2.5 A respectively, and their ground is in accordance with their high power level. However, there are T.W.T.s having a lower power level than of the order of 1 kW, more suitable for the implementation of this invention. One preferably uses active components as a power source in the radar according to the invention, which are constituted by gallium-arsenide Impatt diodes regrouped in one or several multiple diode switches, which allows of obtaining maximum power levels of the order of one to several hundred Watts, whilst the characteristic features of the pulse width and of the cyclic coefficient are comparable to those of the above T.W.T.s. In such multiple diode switches, each Impatt diode is fed by a continuous current supply circuit during the pulse, whereas this current is of the order of 1 A and switches are arranged in series on the supply conductors of the diodes.

If one adheres to a synchronizing signal obtained directly at the output of the Impatt diode from the diode switch fed by continuous current, the lack of linearity of the curve F(t) of this signal can be troublesome for specific applications, especially because the side lobes are too high to cause reception.

Consequently, a first embodiment of the invention intended to improve the linearity in the frequency of the transmission signal of the pulse compression radar is characterized in that the supply circuit comprises a current modulator adjusted to produce in the said Impatt diode, for the duration of the pulse, a modulated current that compensates at least in first instance for the lack of linearity of the synchronizing signal.

A second embodiment for the radar device according to the invention, comprising a diode switch as a power source, compatible with the preceding one, is characterized in that the same clock signal commands simultaneously the supply switch of the Impatt diode of the one-diode switch and the supply switches of the diodes of the multiple diode switch.

A third embodiment for the radar device according to the invention comprising a multiple diode switch as a power source is characterized in that it comprises in the transmit circuit between the one-diode switch and the multiple diode switch a microwave-frequency switch which is commanded to conduct by the clock pulse generator as well as the supply switches of the diodes of the said multiple diode switch for the duration of a first useful pulse, and in that the supply switch of the Impatt diode of the said one-diode switch is commanded to conduct by the said clock pulse generator for the duration of a second pulse including the said first one, for generating each transmission pulse. The microwave-frequency switch is preferably constituted by a PIN diode of which the opening and closing is commanded by a logic power signal coming from the clock pulse generator. This embodiment permits of selecting in the output pulse of the Impatt diode switch, by way of a synchronizing signal, only the central part of the pulse that presents the best frequency linearity as a function of time in the form of a negative frequency slope.

BRIEF DESCRIPTION OF THE DRAWING

The following description referring to the annexed drawing figures, the whole given by way of example, will make it better understood how the invention can be realised, in which.

The FIGS. 8a, 8b, 8c, 8d, 8f are time diagrams

In the Figures the same reference characters designate the same components having the same functions.

DESCRIPTION OF THE PREFERRED EMBODIMENTS

Figure 1:
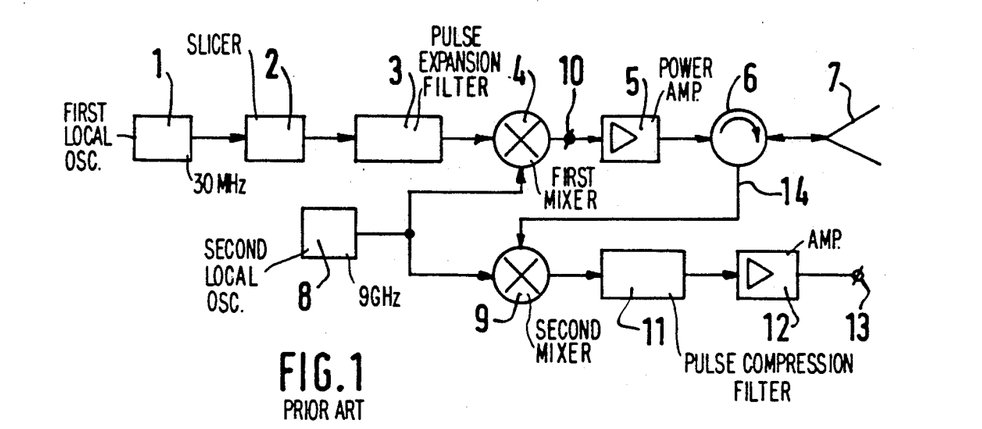
FIG. 1 is a block diagram of a prior art pulse compression radar.

A known pulse compression radar such as represented in FIG. 1 comprises in a cascade arrangement in the transmit circuit: a first local oscillator 1, a slicer 2 and a filter 3, which operate at intermediate frequency, followed by a first mixer 4, a power source 5, a duplexer 6 and an aerial 7 which operate at microwave frequency. The local oscillator 1 supplies an intermediate-frequency signal for example of 30 MHz. This signal is sliced by the slicer 2 into pulses having a duration comprised between several tenths and several tens of microseconds, for example 10 μs, having a cyclic coefficient preferably below 3% and typically equal to 1%. The filter 3 realises an expansion in time of each pulse, in practice the filter 3 produces within the pulse a frequency slope having a positive or negative variation. To clarify the view, it is assumed that the filter 3 is constituted by a line of surface wave comb-shaped transducers producing negative frequency slopes with a frequency swing equal to for example 3 MHz. The mixer 4 provides an additional beat signal between the output signal of filter 3 and a second local oscillator 8 that produces a microwave-frequency signal of for example 9 GHz. The output signal of the mixer 4, at terminal 10, is formed by low-power microwave-frequency pulse signals (9 GHz), exhibiting a linear variation with a negative frequency slope in the pulse (3 MHz in 10 μsec). This signal is amplified to the microwave frequency by the power source 5, for example a T.W.T., to produce a maximum power signal for example equal to 1 kW, or a multiple Impatt diode switch to supply a signal having a typical maximum power level of 100 W. The latter power signal passes through the duplexer 6, for example a circulator, and is then transmitted by the transmit-receive aerial 7.

The receive circuit comprises a cascade arrangement of the aerial 7, the duplexer 6, a second mixer 9, a pulse compression element (filter) 11, an amplifier 12 and the output terminal 13. The low-power echo signal formed by expanded microwave-frequency pulses is captured by the aerial 7, passes through the circulator 6, and from a second output 14 of the latter, is transferred to the mixer 9 which provides a subtractive beat signal between the echo signal and the second microwave-frequency local oscillation signal. Thus, at the output of the mixer 9 a signal is obtained which is comparable to the output signal of filter 3. The intermediate-frequency signal then passes through element 11 which has a transfer function which is practically the reverse of that of filter 3. Element 11 is, for example, a ground wave comb-shaped transducer line and preferably integrates a filtering in a manner known per se in order to diminish the level of the side lobes by approximately −13.5 dB to −30 dB relative to the main lobe. This forms a weighting operation obtained by a slight loss of adaptability of the filter 11 by giving it a non-rectangular transfer function, which causes a slight expansion of the signal (10 to 20%) and a slight filter loss (1 dB). The signal is then amplified in the amplifier 12 and applied by the latter as a useful signal to the output terminal 13.

Figures 2A, 2B:
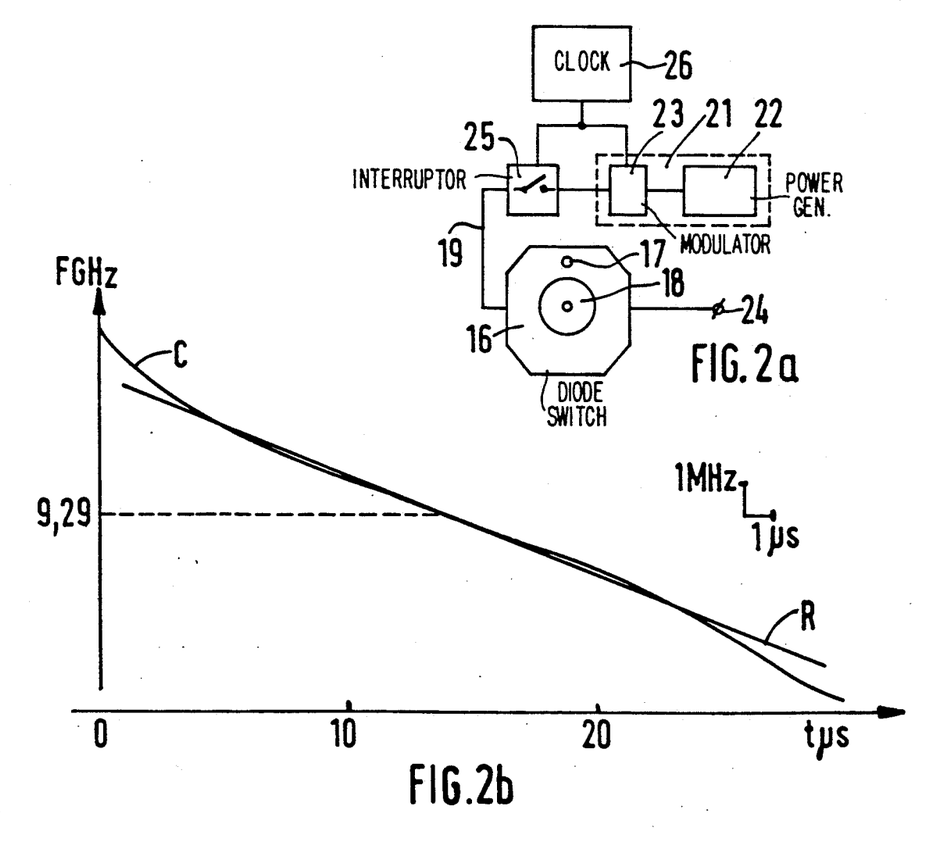
FIG. 2a is the block diagram of an Impatt diode switch including a supply circuit and a switch on the supply conductor.
FIG. 2b shows the curve of the frequency response plotted against time F(t) of the switch of FIG. 2a of which the Impatt diode is fed with continuous current.

In the pulse compression radar according to the invention, the components 5 to 13 of the FIG. 1 are retained and the components 1 to 4 are replaced by the circuit of the FIG. 2a.

In the diagram of FIG. 2a is represented a one-diode switching circuit (diode switch) 16 comprising a single Impatt diode 17. The switch 16 has a cavity 18 and constitutes a resonator. The Impatt diode is fed via the conductor 19 by a supply circuit 21, itself formed by a power generator 22 and a modulator 23. In order to produce at the terminal of output 24 a microwave signal formed by microwave-frequency pulses, an interruptor circuit (interruptor) 25 is connected in series with the conductor 19. The opening and closing of the interruptor 25 is commanded by a logic power signal from a clock pulse generator 26, which same clock pulse signal also commands the modulator 23.

The (multiple) Impatt diode switches are well known in high-frequency oscillator technology. The switch 16 is preferably a circular switch, that is to say that its cavity 18 is cylindrical, as described for example in the U.S. Pat. No. 3,931,587 which concerns the operating principle. The Impatt diode 17 is for example a diode MA 46045, manufactured by the American company of MACOM, which diode is fed by a current comprised between 0.8 and 1.2 A and can provide a maximum power level of 12.5 W. The chosen oscillation frequency, which corresponds to one out of several modes, determined by the cavity, and the adaptation to this cavity, is for example equal to 9300 MHz. It is likewise possible to choose an Impatt diode presenting a comparable performance and produced by the American company of VARIAN or by the Japanese company of NEC.

To obtain the desired current form in the Impatt diode 17 the power generator 22 applies to the modulator 23 a power signal of the order of 60 to 80 V. The modulator 23 is preferably formed by a set of transistors which function as amplifiers and receive on their bases logic control signals based on the control signal originating from the clock pulse generator 26. The interruptor 25 is preferably constituted by a V.MOS field effect transistor controlled by a logic power signal on its gate.

Figure 3:
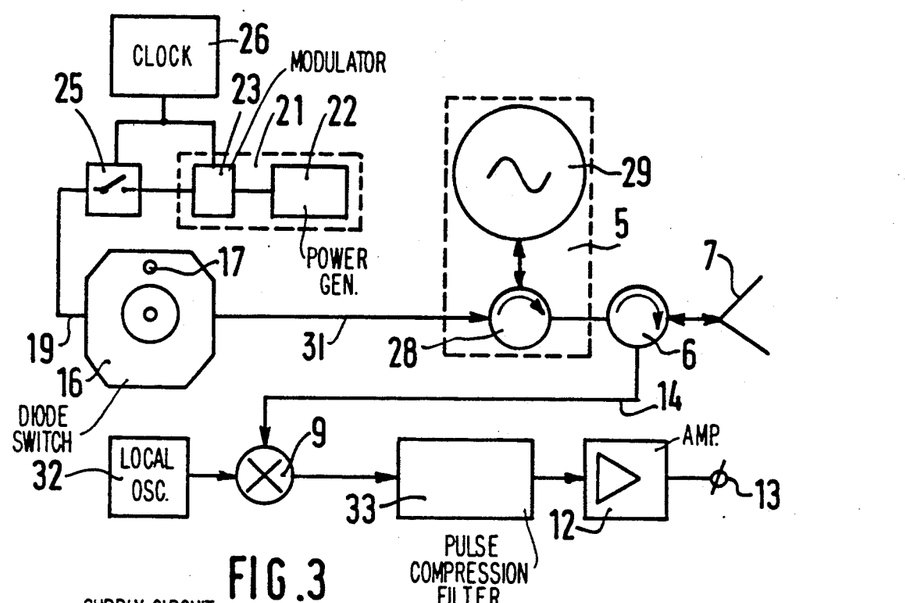
FIG. 3 is the block diagram of a first embodiment for the pulse compression radar according to the invention.

The modulator 23 is normally designed to supply a continuous current, of for example 1 A to the Impatt diode 17, so as to constitute a current source for the duration of each pulse. When a continuous current is injected into an Impatt diode of the type mentioned hereinbefore, arranged in a diode switch 16, the frequency response curve plotted against time at the output terminal 24, F(t), for a pulse having a maximum width of 32μ seconds permitted by the diode, is represented by C in FIG. 2b. The curve C can in a first approximation be assimilated to a negative frequency slope, R, having a variation of 0.302 MHz/μsec, around 9290 MHz, or for example 2.4 MHz in 8 μsec. The curve C is obtained for a continuous current of approximately 0.85 A and assumes the form of a very elongated S around the straight line R, whereas the portions of the curve C deviating most from the slope R are formed by the part that corresponds with the first three microseconds of the pulse and, for a pulse of a longer duration, the part situated beyond the 26 μsec after the beginning of the pulse. The practically linear zone thus stretches out over approximately 20 μsec with a corresponding frequency swing Δf of approximately 6 MHz. The theoretical frequency response curve which is normally wished for at the output of the diode switch 16 is a horizontal straight line, that is to say a constant as a function of time. The aspect of the curve C which appears as a fault for the majority of applications of these diodes is derived from the temperature of the diode, linked with the fast rise in temperature of the diode junction during the pulse. In this case this negative almost linear variation is used for producing the desired signal form for a pulse compression radar, whereas it is given, for that matter, that the obtained values of the frequency swing ΔF are suitable and that the junction of the Impatt diode 17 has a time which is sufficient for cooling down between two pulses, whereas it is given, that the cyclic coefficients used are comprised between 1 and 3%. For a current modulator of 1.2 A instead of 0.85 A the frequency swing ΔF is at approximately 10 MHz for the same duration, whereas the form of the curve C remains substantially the same. When the signal at the terminal 24 is used as a synchronizing signal from the power source 5, FIG. 1, that is to say, when the terminals 10 and 24 are connected, while assuming that the elements 1 to 4 are absent, the radar according to the invention is obtained in its most simple and general embodiment as represented in FIG. 3. The digital values concerning the curve C which are indicated hereinbefore imply that a compression coefficient T.ΔF of the order of 200 may be anticipated for the compression radar according to the invention.

In FIG. 3 the power source 5 is simplified in the form of a circulator 28 connected to an oscillator-amplifier 29 which is preferably a multiple Impatt diode switch. It will be evident that the synchronizing signal of the oscillator 29 on the conductor 31 is directly obtained at microwave frequency, which greatly simplifies the transmit circuit of the radar. At the receive end the local oscillator, referenced 32, supplies a signal of which the continuous frequency is preferably lower than the frequency of the pulsed echo signal applied to the input of the mixer 9. For example, the local oscillator 32 supplies a signal having a frequency of 9260 MHz and the mixer 9 produces a subtractive beat signal between the frequency of the echo signal (intermediate frequency of 9290 MHz) and the continuous frequency of 9260 MHz. The mixer 9 thus furnishes at its output a pulse signal of which the frequency is equal to the difference between the frequency of the echo signal and that of the signal produced by the local oscillator 32. The pulse compression element, referenced 33, is to have a reverse transfer function to that of the multiple diode switch 16. Together with the Impatt diode 17 chosen earlier, the element 33 is for example a ground wave comb-shaped transducer line, of the DS-30-3, 6-8-131 A type manufactured by the American company of ANDERSEN LABORATORIES. This line which integrates a weighting with respect to reducing the level of the side lobes, has the following characteristic features:
central frequency: 30 MHz
passband: 3.6 MHz
dispersion: 8 μsec
weighting: ≦32 dB
slope: positive
insertion: ≦30 dB
compressed pulse: ≈400 nsec
dimensions: 5.05×2.51×0.58 cm.
The element 33 can also be specially arranged for the radar of FIG. 3, which specifically implies that its transfer function can take the nonlinearities of the curve C, FIG. 2b, into account in order to compensate for them, together with the reduction of the side lobes, which is always desirable. In this connection it should be observed that the above ANDERSEN line reduces the side lobes to −32 dB.

The radar of FIG. 3 is suitable for applications requiring average performance, but with a definition and a range which have considerably improved with respect to the ratio of the compression coefficient to the coefficient of a conventional comparable high-frequency non-compression pulse radar.

Figure 4:
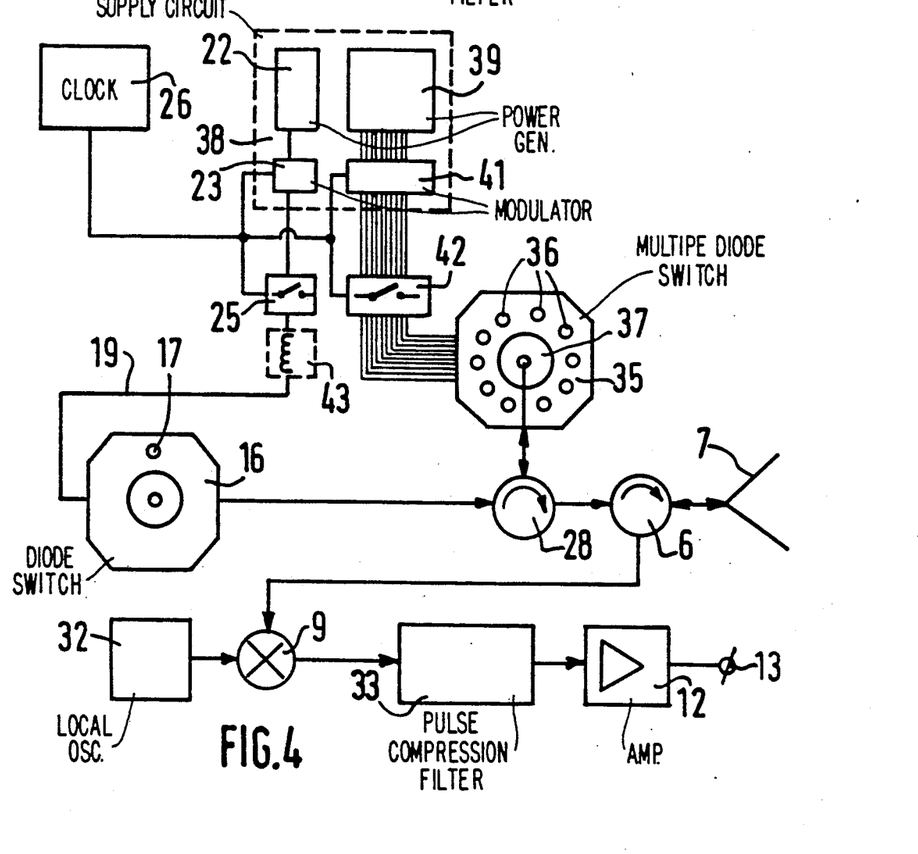
FIG. 4 is the block diagram of a second embodiment for the pulse compression radar according to the invention.

FIG. 4 represents a radar similar to the one shown in FIG. 3, in which the power source is constituted by a circular multiple Impatt diode switch 35. This switch 35 is comparable to the switch 16 except for the fact that it comprises 10 Impatt diodes 36 and that it is synchronized from its cavity 37 by the output signal of the switch 16 which has passed through a portion of the circulator 28. The supply circuit 38 which comprises the elements 22 and 23 also includes a power generator 39 and a modulator 41, and interruptors 42 are connected in series with the supply conductors of the Impatt diodes 36. These diodes 36 are supplied with a continuous current and the elements 39, 41 and 42 are similar to the elements 22, 23 and 25 respectively. A separate supply circuit for each diode 36 allows of adjusting the current in each diode independently. If there is a slight dispersion of characteristics between the diodes 36, one may consider supplying several of them from the same supply circuit. In the circuit of FIG. 4, the same clock signal simultaneously commands the switches 25 and 42 and in a similar way the modulators 23 and 41.

The non-linearities of the curve C, FIG. 2b, can be compensated for in a way known per se, and with respect to the circuits of FIGS. 3 and 4 in a passive and/or active way. The passive way consists of introducing a coil having a suitable value and connected in series with the conductor 19, as represented in FIG. 4 by the broken line 43. The active way, which permits to realise a rather precise linearity of curve C in accordance with the straight line R and which is within grasp of those skilled in the art, consists of modifying the value of the supply voltage and/or adjusting the control of the modulator 25 so that the latter produces a variable current of approximately one tenth ampere for the duration of the pulse, in accordance with an intensity curve as a function of the time which is favourable for the desired linearity. Another means of improving the linearity of curve C, comparable to the preceding ones, is described hereinbelow with reference to FIG. 5.

Figure 5:
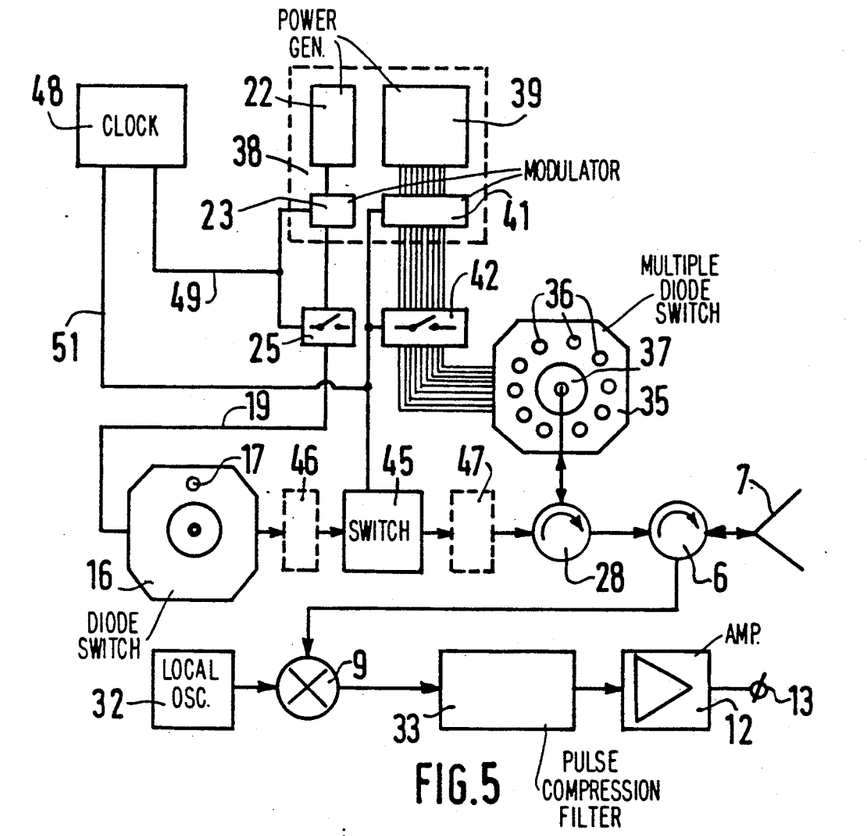
FIG. 5 is the block diagram of a third embodiment for the pulse compression radar according to the invention.
Figure 6A:
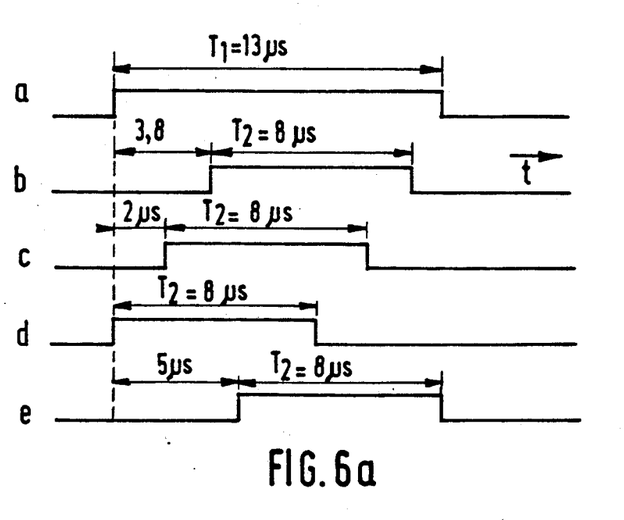
FIG. 6a represents different positions in time of a first useful pulse interval within a second pulse interval at the output of the Impatt diode oscillator and the FIGS. 6b, 6c, 6d and 6e represent the spectra of the corresponding microwave-frequency signals.
Figure 6B:
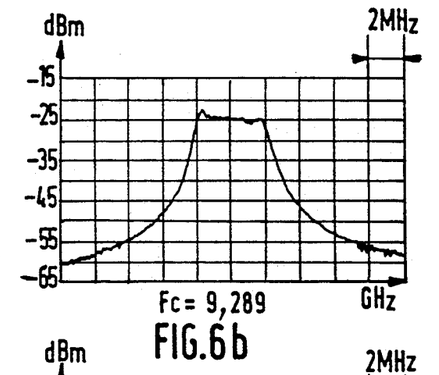
Figure 6C:
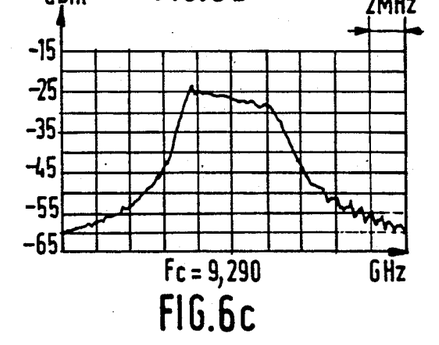
Figure 6D:
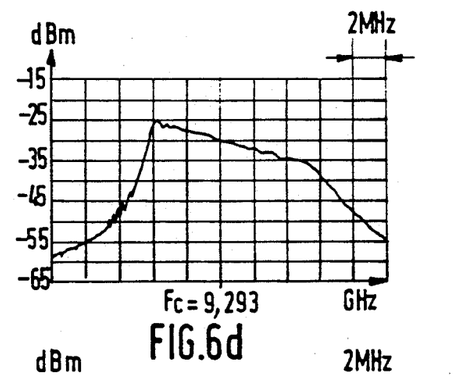
Figure 6E:
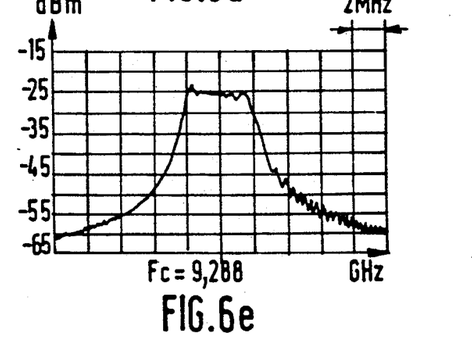

The circuit of FIG. 5 differs from that of FIG. 4 primarily in that a microwave-frequency switch 45 is inserted between the diode switch 16 and the circulator 28. The switch 45 is preferably constituted by a PIN diode which can be commanded by a logic power signal, and two insulators 46 and 47 are fitted on either one of the two sides of the switch 45. The clock pulse generator 48 produces two pulse control signals. A first signal, on the conductor 49, controls the switch 25 and the modulator 23 for producing pulses of a duration T1, for example equal to 13 μsec, as represented in FIG. 6a. A second signal, on a conductor 51, simultaneously controls the switches 42 and the modulator 41, that is to say the feeding of the Impatt diodes 36, and the microwave-frequency switch 45 for producing useful pulses of a duration T2. Each conduction period T2 of the diodes 36 lies within a corresponding conduction period T1 of the diode 17. It is thus possible to realise on curve C a shutter or a weighting aperture, allowing of selecting the most linear part of this curve. The results obtained are indicated hereinafter with reference to the FIGS. 6a to 6e.

For the positions b and e of the useful pulse: T2=8 μsec, the most distant from the start of the pulse: T1=13 μsec, FIG. 6a approaches most a theoretical spectrum, compare the spectra of the FIGS. 6b and 6e, the difference relative to the perfect theoretical spectrum being due to the residual non-linearities of the curve C, whereas the spectra of the FIGS. 6c and 6d clearly show the very unfavourable influence of the strong non-linearity at the beginning of pulse T1. It should be observed, when examining the spectra of the FIGS. 6b to 6e, that the faults in the linearity are no faults of the sinusoidal modulation type, for passing from the slope R to the curve C, which would mean spectra clearly indented on either one of the two sides of the central frequency Fc. In lieu of this one will only see a slight amplitude reduction in the spectrum. The latter type of fault approaches a fault of the exponential or quadratic type of which the influence on the compressed pulse is less strong than a sinusoidal fault and which is manifested in a widening of the central peak and a mean number for the set of side lobes. The type of fault under consideration can be partly corrected by means of the pulse compression element 33, more precisely by means of the weighting filter of the side lobes, generally integrated in element 33.

In the radar device of FIG. 5, a multiple diode switch 35, having a maximum output power level of approximately 100 W, is synchronized by an input signal of the order of 7 W in the cavity 37. It will be known that in the case of injection-locking oscillators, the maximum synchronizing band dF is derived in a first approximation from the equation:

$$dF = \frac{2 Fc}{QL} \left( \frac{Pe}{Ps} \right)^{\frac{1}{2}} \quad (1)$$

where:
Ps: output power (100 W)
QL: 100
Fc: central frequency (9290 MHz)
or:
dF=49 MHz.

Well, the frequency variation range for the pulse under consideration, which is shown in the FIGS. 6b to 6e, is only of the order of 4 MHz (typically 3.6 MHz). The above equation (1) indicates that for a synchronizing signal power equal to 7 W it is possible to augment the power of the radar shown in FIG. 5 without modifying the fundamental structure of the circuit. Therefore, it will be sufficient to augment the power of the power source, in a way not shown, for example by increasing the number of Impatt diodes of the switch 35 (16 in lieu of 10 diodes) and/or connecting in parallel two or three synchronized multiple diode switches 35 by means of the same signal coming from the circulator 28. It is then possible to obtain a pulse compression radar as shown in the circuit of FIG. 4 or FIG. 5, having a maximum power level of approximately 300 W.

According to a further embodiment of the invention, not shown in the block diagrams, it is likewise possible to augment in a manner known per se the power of the radars of FIGS. 4 and 5 by adding an extra power stage, consisting of inserting between the circulators 28 and 6 a third circulator connected to several multiple diode switches such as 35 (approximately 10 switches), which simultaneously receive the output signal of the circulator 28 as a synchronizing signal. This permits to obtain a pulse compression radar according to the invention having a maximum power level of the order of 1 kW.

Figure 7:
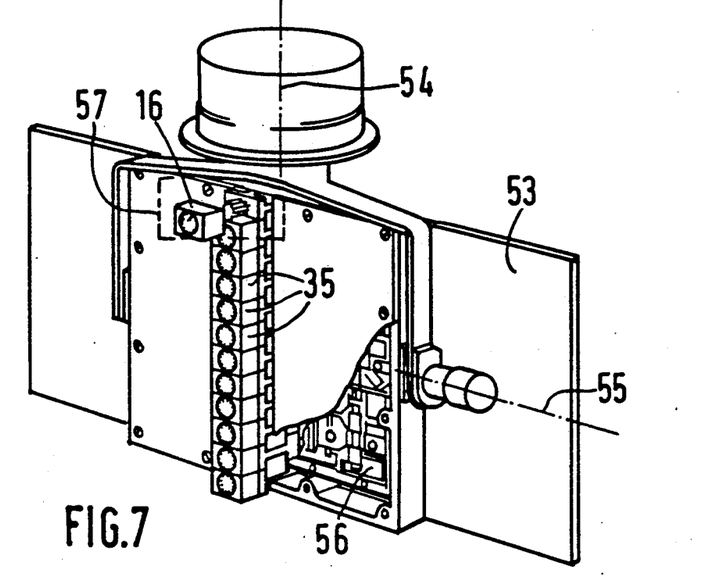
FIG. 7 is a perspective cut-away view of a slotted aerial supporting the microwave-frequency circuits of the radar according to the invention.

To produce the power source synchronizing signal directly at a microwave frequency, when positioning the high-frequency portions of the transmit circuit and receive circuit of the radar device behind a slotted aerial, allows of realising a compact and light weight transmit-receive aerial, as shown in FIG. 7.

In FIG. 7 the reference 53 designates a slotted aerial supporting at the rear the unit of the microwave-frequency transmit and receive circuits of the radar. The horizontal and vertical pivoting axes of the unit are referenced 54 and 55 respectively. The circuit shown, providing a power level of approximately 1 kW, comprises a diode switch 16 and 11 multiple diode switches 35. The switches as well as the microelectronic circuits 56 operating at microwave frequencies are preferably realised according to hybrid circuit technology.

If the radar is formed for operating under severe temperature conditions, which may vary from −40° C. to +85° C., for example, it will be advantageous, according to a variant of the invention, to locate at least the diode switch 16 in a thermostatic housing as symbolically represented by the broken lines 57 in FIG. 7.

The chief applications intended for the pulse compression radar according to the invention are found in the fields of meteorology and/or mapping, whereas the radar is located on the ground or is airborne. For power levels of the order of kW an application for maritime surveillance can be thought of. Generally speaking, the applications are those of the pulse compression radar.

Figure 8A:
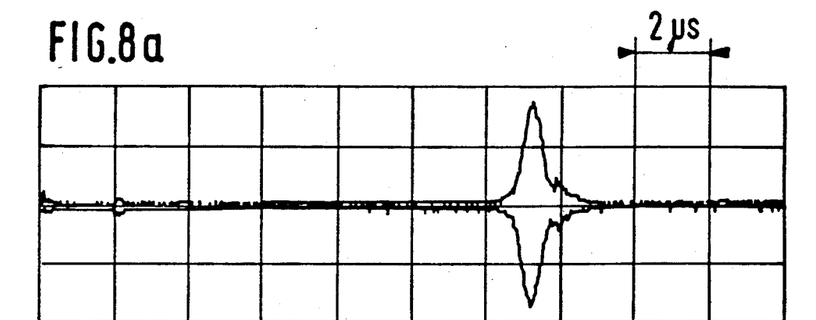
Figure 8B:
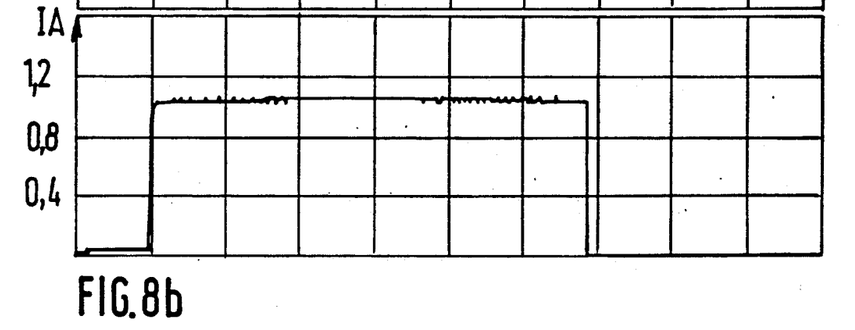
Figure 8C:
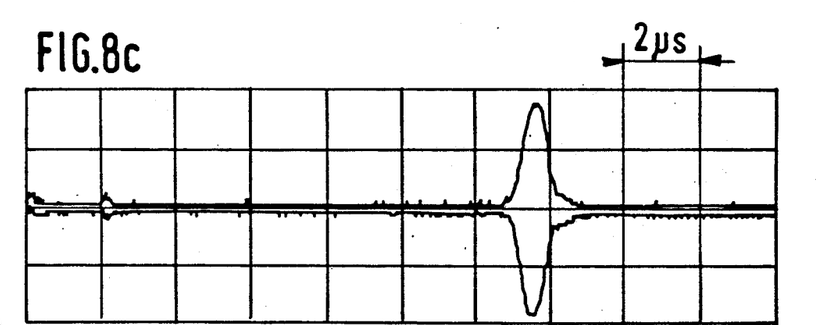
Figure 8D:
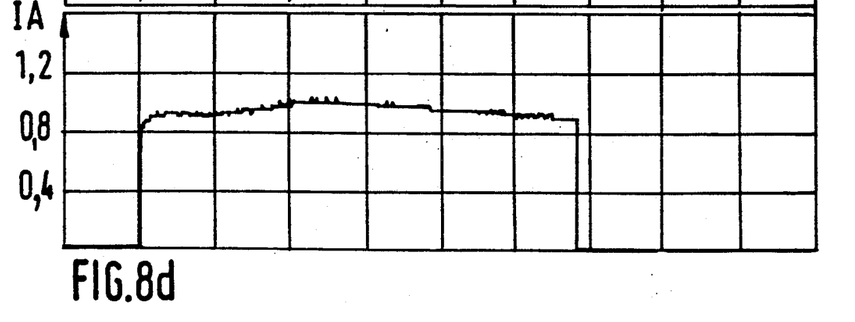
Figure 8E:
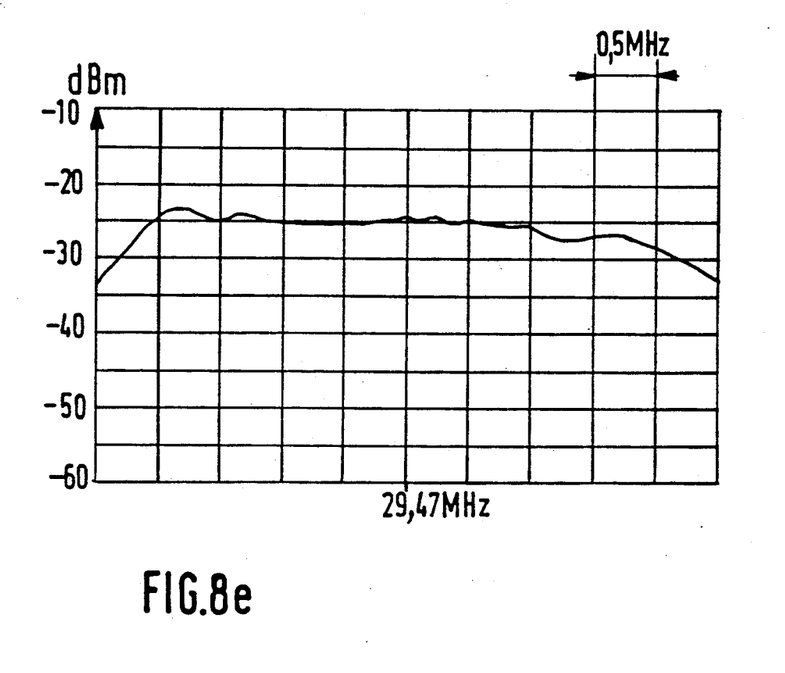
FIG. 8e is a spectrum, used for the explanation of the operation of the pulse compression radar according to the invention.
Figure 8F:
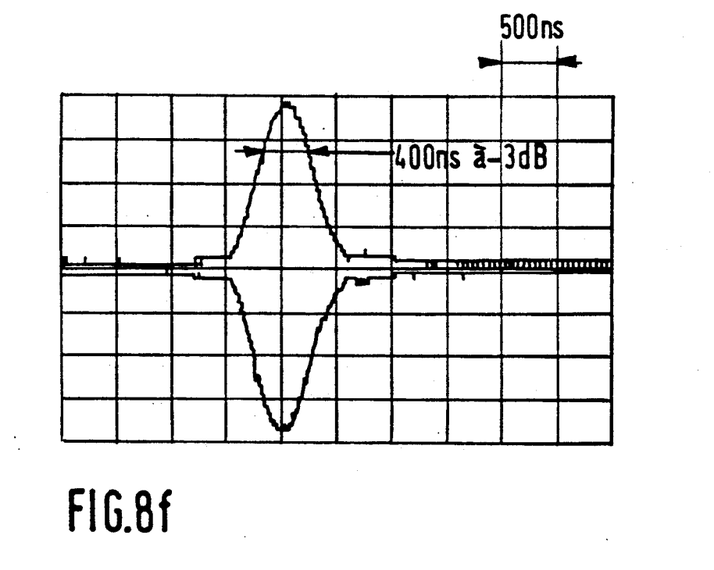

Results obtained when utilizing an Impatt diode 17 manufactured by MACOM and a line 33 manufactured by ANDERSEN LABORATORIES described hereinbefore, are indicated in FIGS. 8a to 8f where the abscissa and the ordinates are represented on a linear scale. The FIG. 8a represents the form of this signal at the output terminal 13 of the radar, for the embodiment as shown in FIG. 5, with a continuous modulating current in the Impatt diode 17, represented in FIG. 8b. In the compressed pulse of FIG. 8a side lobes can be seen having a high level. In FIGS. 8c and 8d analogous with the FIGS. 8a and 8b respectively, still relating to the embodiment of FIG. 5, the current modulator causes a total amplitude variation of approximately 0.1 A, FIG. 8d, and the side lobes of the compressed pulse, FIG. 8c, are distinctly attenuated. The FIGS. 8e and 8f relate to the circuit of FIG. 5 in which both the position of the slicer aperture of pulse T1 by pulse T2 and the value of the modulating current in the Impatt diode 17 have been optimized. The spectrum of the useful pulse T2 before compression is represented in FIG. 8e and, as regards the representation of the compressed pulse of FIG. 8f, it is established that the side lobes are reduced to −20 dB relative to the main lobe.

What is claimed is:

1. A pulse compression radar of the type comprising a transmit circuit including pulse generating means for producing a substantially linearly frequency modulated pulse, an antenna coupled to the transmit circuit for transmitting the pulse toward an object and receiving a respective reflection pulse from said object, and a receive circuit including pulse compression means coupled to the antenna for processing said reflection pulse, characterized in that said pulse generating means comprises:
   a. a semiconductor device which produces a substantially linearly varying frequency signal during a warm-up period when power of a predetermined magnitude is applied to said device;
   b. a supply circuit for producing power of at least said predetermined magnitude; and
   c. timing means coupled to the semiconductor device and to the supply circuit for effecting application of the power produced by the supply circuit to the semiconductor device during a predefined period within the warm-up period to effect production of said frequency modulated pulse.

2. A pulse compression radar as in claim 1 where the semiconductor device comprises an Impatt diode.

3. A pulse compression radar as in claim 1 or 2 where the supply circuit comprises a current modulator for producing during said predefined period a modulated current for powering the semiconductor device, said current being modulated to improve the linearity of the frequency variation of the signal produced by said semiconductor device.

4. A pulse compression radar as in claim 1 where the semiconductor device comprises a plurality of Impatt diodes.

5. A pulse compression radar as in claim 4 where the supply circuit comprises a current modulator for producing during said predefined period a modulated current for powering the semiconductor device, said current being modulated to improve the linearity of the frequency variation of the signal produced by said semiconductor device.

6. A pulse compression radar as in claim 4 or 5 where the timing means comprises an Impatt diode switch coupled to said plurality of Impatt diodes for producing a signal to effect synchronization of signal production by said diodes.

7. A pulse compression radar as in claim 6 where the timing means comprises a microwave frequency switch coupling the Impatt diode switch to the plurality of Impatt diodes, said microwave frequency switch passing the signal produced by the Impatt diode switch to the plurality of Impatt diodes during a portion of the predefined period.

8. A pulse compression radar as in claim 1 or 2 where the antenna comprises a slotted antenna and where high frequency portions of the transmit circuit and the receive circuit are affixed to said antenna.

9. A pulse compression radar as in claim 8 where the transmit and receive circuits comprise hybrid circuits.

10. A pulse compression radar as in claim 1 or 2 where the semiconductor device is disposed in a thermostatic housing.

* * * * *